US 6,566,272 B2

(12) United States Patent
Paterson et al.

(10) Patent No.: US 6,566,272 B2
(45) Date of Patent: May 20, 2003

(54) METHOD FOR PROVIDING PULSED PLASMA DURING A PORTION OF A SEMICONDUCTOR WAFER PROCESS

(75) Inventors: Alex Paterson, San Jose, CA (US); John M. Yamartino, Palo Alto, CA (US); Peter K. Loewenhardt, San Jose, CA (US); Wade Zawalski, San Francisco, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/360,883

(22) Filed: Jul. 23, 1999

(65) Prior Publication Data

US 2002/0052111 A1 May 2, 2002

(51) Int. Cl.⁷ ............... H01L 21/302; H01L 21/3065
(52) U.S. Cl. .................. 438/710; 438/712; 438/730
(58) Field of Search ............... 438/712, 710, 438/730

(56) References Cited

U.S. PATENT DOCUMENTS

| | | | |
|---|---|---|---|
| 4,163,172 A | | 7/1979 | Loda ..................... 313/302 |
| 4,263,088 A | * | 4/1981 | Gorin ..................... 438/9 |
| 4,357,195 A | * | 11/1982 | Gorin ..................... 156/345 |
| 4,539,068 A | | 9/1985 | Takagi et al. ............ 156/614 |
| 4,570,106 A | | 2/1986 | Sohval et al. ........ 315/111.81 |
| 4,837,185 A | | 6/1989 | Yau et al. ............... 437/228 |
| 4,863,549 A | | 9/1989 | Grunwald ............... 156/345 |
| 4,889,588 A | | 12/1989 | Fior ....................... 156/643 |
| 4,891,118 A | | 1/1990 | Ooiwa et al. ............ 204/298 |
| 4,963,239 A | | 10/1990 | Shimamura et al. ... 204/192.12 |
| 5,013,578 A | | 5/1991 | Brown et al. ............ 427/37 |
| 5,057,185 A | | 10/1991 | Thomas, III et al. ..... 156/643 |

(List continued on next page.)

FOREIGN PATENT DOCUMENTS

| | | | |
|---|---|---|---|
| EP | 0 503 082 A1 | 9/1992 | ............ B01J/19/08 |
| EP | 0 878 842 A1 | 11/1998 | ............ H01L/21/66 |
| JP | 61-1023 | 1/1986 | ............ H01L/21/302 |
| JP | 2-312227 | 12/1990 | ............ H01L/21/302 |
| JP | 5-21392 | 1/1993 | ............ H01L/21/302 |
| JP | 5-299378 | 11/1993 | ............ H01L/21/302 |
| JP | 5-339760 | 12/1993 | ............ C23F/4/00 |
| JP | 5-339761 | 12/1993 | ............ C23F/4/00 |
| JP | 6-122984 | 5/1994 | ............ C23F/4/00 |
| JP | 6-181185 | 6/1994 | ............ H01L/21/302 |
| JP | 6-216047 | 8/1994 | ............ H01L/21/205 |
| JP | 6-342769 | 12/1994 | ............ H01L/21/302 |
| JP | 10312899 A | * 11/1998 | ............ H01L/21/205 |

OTHER PUBLICATIONS

Kubota et al., Plasma Processing Method and Plasma Processing Device, (English translation of JP 10312899 A), Nov. 24, 1998, 6 pages.*

Maruyama et al. "Reduction of Charge Build–Up with Pulse–Modulated Bias in Pulsed Electron Cyclotron Resonance Plasma" Jpn. J. Appl. Phys., vol. 37, Part 1, No. 4B, pp. 2306–2310, Apr. 1998.

Ikeda et al. "TOP–PECVD: A New Conformal Plasma Enhanced CVD Technology using TEOS, Ozone and Pulse–Modulated RF Plasma" IEEE, pp. 289–292, Dec. 13, 1992.

Hashimoto et al "Reduction of the Charging Damage from Electron Shading" *1st International Symposium on Plasma Process–Induced Damage*, pp. 43–46, May 13–14, 1996.

*Primary Examiner*—George Goudreau
*Assistant Examiner*—Lynette T. Umez-Eronini
(74) *Attorney, Agent, or Firm*—Moser, Patterson & Sheridan; Joseph Bach

(57) ABSTRACT

A method for processing a semiconductor wafer with a plasma using continuous RF power for a first phase of wafer processing and with pulsed RF power for a second phase of wafer processing.

13 Claims, 5 Drawing Sheets

U.S. PATENT DOCUMENTS

| | | |
|---|---|---|
| 5,087,857 A | 2/1992 | Ahn .................. 315/111.21 |
| 5,093,151 A | 3/1992 | van den Berg et al. ....... 427/39 |
| 5,110,438 A | 5/1992 | Ohmi et al. .......... 204/298.34 |
| 5,160,397 A | 11/1992 | Doki et al. ................ 156/345 |
| 5,160,408 A | 11/1992 | Long ......................... 156/656 |
| 5,173,328 A | 12/1992 | Reiter et al. ............... 427/576 |
| 5,212,118 A | 5/1993 | Saxena ...................... 437/235 |
| 5,231,057 A | 7/1993 | Doki et al. ................ 437/225 |
| 5,259,922 A * | 11/1993 | Yamano et al. ............ 438/720 |
| 5,273,609 A | 12/1993 | Moslehi .................... 156/345 |
| 5,308,650 A | 5/1994 | Krummel et al. .......... 427/570 |
| 5,310,452 A | 5/1994 | Doki et al. ................ 156/643 |
| 5,346,578 A | 9/1994 | Benzing et al. ............ 156/345 |
| 5,352,324 A | 10/1994 | Gotoh et al. .............. 156/643 |
| 5,362,358 A | 11/1994 | Yamagata et al. ......... 156/643 |
| 5,370,779 A | 12/1994 | Ohba et al. ............ 204/192.34 |
| 5,405,492 A | 4/1995 | Moslehi .................... 156/643 |
| 5,435,886 A | 7/1995 | Fujiwara et al. ......... 156/643.1 |
| 5,460,689 A * | 10/1995 | Raaijmakers et al. ....... 438/713 |
| 5,468,296 A | 11/1995 | Patrick et al. ........ 118/723 MP |
| 5,468,341 A | 11/1995 | Samukawa .................. 216/69 |
| 5,472,508 A | 12/1995 | Saxena .................. 118/723 E |
| 5,514,603 A | 5/1996 | Sato ............................ 437/16 |
| 5,525,805 A | 6/1996 | Greenly ................. 250/423 R |
| 5,534,751 A | 7/1996 | Lenz et al. ............. 315/111.71 |
| 5,558,718 A | 9/1996 | Leung .................... 118/723 E |
| 5,597,495 A * | 1/1997 | Keil et al. ..................... 216/66 |
| 5,614,060 A | 3/1997 | Hanawa .................. 156/643.1 |
| 5,662,819 A | 9/1997 | Kadomura .................. 438/711 |
| 5,683,538 A | 11/1997 | O'Neill et al. .............. 156/345 |
| 5,696,428 A | 12/1997 | Pasch .................... 315/111.21 |
| 5,698,062 A | 12/1997 | Sakamoto et al. .......... 156/345 |
| 5,705,081 A | 1/1998 | Inazawa et al. ................ 216/71 |
| 5,707,486 A | 1/1998 | Collins .................... 156/643.1 |
| 5,723,386 A | 3/1998 | Ishikawa .................... 438/787 |
| 5,770,097 A | 6/1998 | O'Neill et al. ................ 216/60 |
| 5,800,688 A | 9/1998 | Lantsman et al. ..... 204/298.11 |
| 5,810,982 A | 9/1998 | Sellers ................. 204/298.08 |
| 5,827,435 A | 10/1998 | Samukawa .................. 216/69 |

* cited by examiner

METHOD FOR PROVIDING PULSED PLASMA DURING A PORTION OF A SEMICONDUCTOR WAFER PROCESS

BACKGROUND OF THE DISCLOSURE

1. Field of the Invention

The invention relates to semiconductor wafer processing systems. More particularly, the invention relates to a method for providing pulsed plasma in a semiconductor wafer processing system.

2. Description of the Background Art

As structures fabricated upon semiconductor wafers are reduced in size, charging damage has become a serious problem. Charging damage generally occurs when structures being formed on a semiconductor wafer using a plasma enhanced process cause non-uniform charging of the structures such that a differential voltage is formed on the structures. Such a differential voltage can produce high currents or arcing in the structure that damages the structure. For example, a plasma etch process can damage the gate oxide of a transistor structure due to a Fowler-Nordheim current produced by structure charging.

Electron shading is one of the main contributors to structure charging. Electron shading is caused by the formation of structures having a dense line pattern having a high aspect ratio. Electron shading results from the isotropic movement of electrons in a process chamber during plasma processing versus the anisotropic movement of ions contained in the plasma. The electrons impact the sidewalls and other vertical surfaces of the structures and charge the structures. However, a high aspect ratio of these structures causes portions near the plasma to be impacted by more electrons than the "deep" portions of the structure. As such, the "shading" of the deep portions results in a voltage differential over the structure. Such structure charging may result from the use of any plasma process to process a wafer. As a result, many plasma processes are capable of causing topography dependent charging damage of structures on a semiconductor wafer. Topography dependent charging impacts many aspects of semiconductor wafer processing including: electron shading damage, notching, loss of profile control, aspect ratio dependent etching, etch stop, microloading, decreased photoresist selectivity, photoresist striations, and decreased etch rate.

Therefore, a need exists in the art for a method of reducing topography dependent charging.

SUMMARY OF THE INVENTION

The disadvantages associated with the prior art are overcome by the present invention of a method for plasma processing a semiconductor wafer using a pulsed RF power. In the method of the present invention, RF power is applied to a process gas to form a plasma in a chamber. The wafer is processed with the plasma using continuous RF power for a first period of time $T_1$ (a first phase of processing) and with pulsed RF power a second period of time $T_2$ (a second phase of processing). The time $T_1$ includes, for example, an initial portion of a main etch process, while the time $T_2$ includes a final portion of the main etch process and at least a portion of an over etch process. The pulsed power applied during time $T_2$ minimizes damage to circuits formed on the wafer as a result of charging and greatly reduces electron shading and other undesirable effects of wafer processing with plasma. For certain types of plasma processes, the continuous power may be applied during the second period and the pulsed power may be applied during the first period. Also, pulsed power may be applied during multiple phases of a plasma process, e.g., continuous power, then pulsed power, then continuous power, then pulsed power.

The method of the present invention can be implemented as a program code stored in a computer readable storage medium. The program code is executed by a computer to control a semiconductor wafer processing system during wafer processing. The semiconductor wafer processing system comprises a processing chamber and a RF power supply that is controlled in accordance with the method of the present invention.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
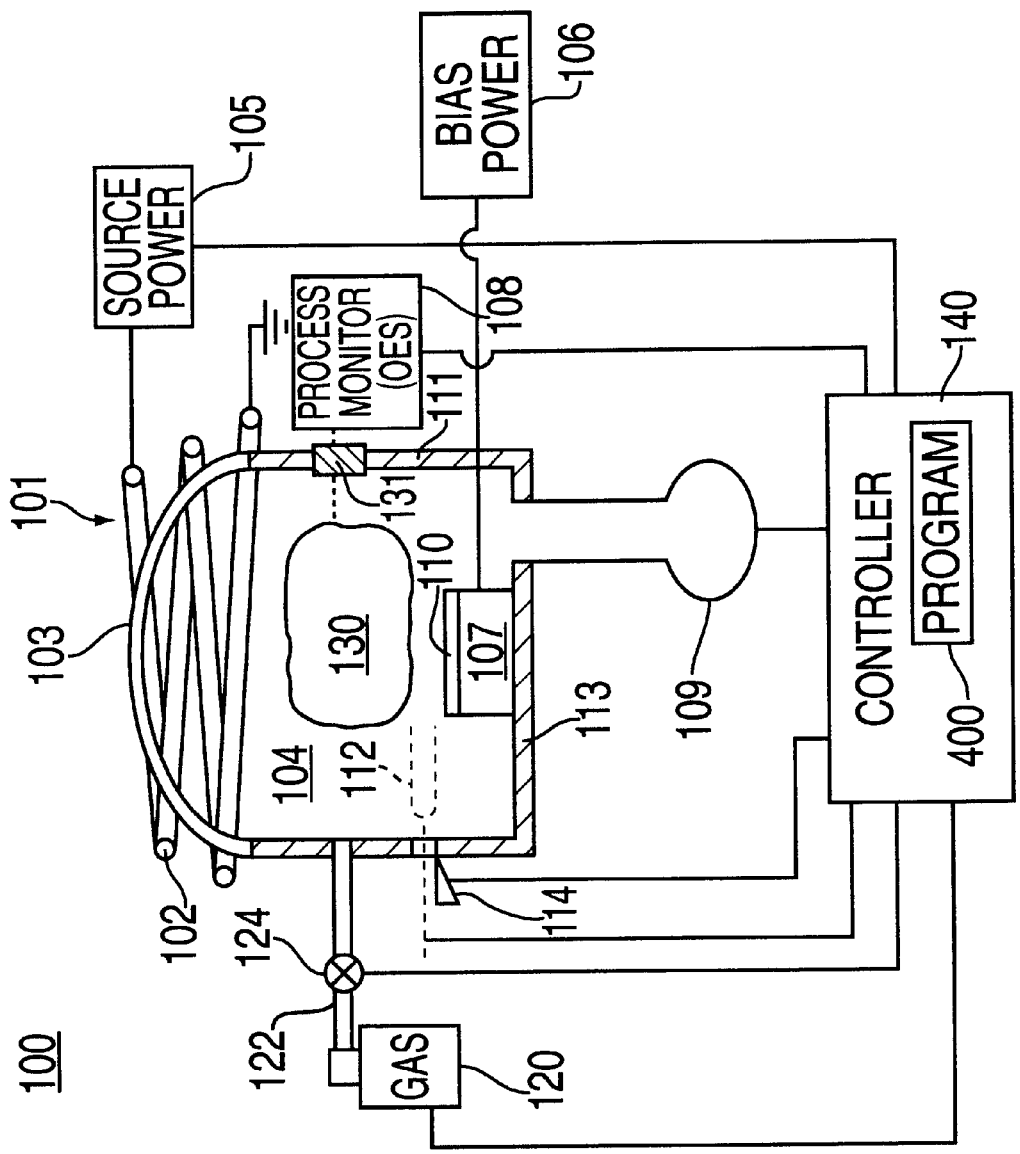
FIG. 1 shows a semiconductor wafer processing system for implementing the method of the present invention.

FIG. 1 depicts a schematic diagram of a plasma enhanced semiconductor wafer processing system 100. The depicted system is illustratively an inductively coupled plasma etch system. The invention, however, is applicable to any plasma enhanced semiconductor wafer processing system such as systems that perform plasma enhanced chemical vapor deposition, physical vapor deposition, plasma annealing, and the like. In short, the invention would benefit any system that may cause topographically dependent charging of structures upon a semiconductor wafer.

The system 100 comprises a process chamber 101, a source power supply 105, a bias power supply 106 and a controller 140. The process chamber 101 comprises a process volume 104 defined by a top 103, a cylindrical sidewall 111, and a bottom 113. The source power supply 105 couples an RF signal (e.g., 2 MHz) to an antenna 102. The antenna 102, having a plurality of turns located proximate the top 103, produces an RF magnetic field that excites a process gas (or gases) (e.g., chlorine) located in the volume 104 to form a plasma 130. A semiconductor wafer 110 containing integrated circuit structures that are susceptible to charging damage is supported upon a pedestal 107. The wafer 110 is exposed to the plasma to facilitate processing of the wafer 110. The pedestal 107 and thus the wafer 110 is biased by an RF signal (e.g., 13.56 MHz) supplied to the pedestal 107 by the bias power supply 106.

A process monitor 108 monitors conditions within the process chamber 101. The process monitor 108 can be any sensor for measuring a condition that is dependent on the process occuring within the chamber 101. By way of example, the process monitor 108 such as an Optical Emission Spectrometer (OES). The OES monitors emission of radiation from the plasma 130 through a transparent window 131. Such radiation is dependent on the progress of the process occurring in the process chamber 101. The process monitor 108 and various components of the system 100 are coupled to the controller 140. The controller 140 includes hardware to provide the necessary signals to initiate, monitor, regulate, and terminate the processes occurring in the process chamber 101.

The process chamber 101 is, for example, a decoupled plasma source (DPS) etch chamber manufactured by Applied Materials of Santa Clara, Calif. The chamber 101 contains the elements necessary to process a semiconductor wafer. For example, the chamber 101 includes a pedestal 107 (susceptor) that supports a semiconductor wafer 110 during processing. A robot arm 112, shown in phantom, transfers the wafer 110 in and out of the process chamber 101 through a slit valve 114. Although one type of chamber is illustratively described, other process chamber types and designs that have controllable RF power sources may fin the invention beneficial. Such chambers include those that produce high density plasma, have flat coil structures, have remote plasma sources, capacitively coupled reaction chambers and the like.

The exterior of the chamber 101 is typically at ambient atmospheric pressure and the interior of the chamber 101 is held at a reduced pressure during processing. An exhaust system 109 regulates the pressure within the chamber 101. A gas panel 120 delivers process gases to the chamber 101 via a gas line 122 and a valve 124. In a process, such as an etch process, the plasma 130 (e.g., a high density plasma) is formed in the chamber 101 by applying RF power to the process gas. The RF power source 105 energizes the antenna 102 to ignite and sustain a plasma 130 within the chamber 101. Those skilled in the art will realize that a plurality of steps are necessary to excite a plasma in a process chamber, i.e., supply a process gas, apply source power to the antenna, apply bias power to the pedestal and so on. These steps are well within the skill in the art to perform without further explanation.

Once a plasma is excited, the wafer begins to be processed in a manner that may lead to topographically dependent charging, e.g., metal is etched from the wafer to form a line pattern that can experience charging. It has been found, for example, that in an etch process electron shading occurs during the transition from main etch to over etch. At this stage, integrated circuit features on the wafer 110 can charge up due to electrons impinging upon the vertical walls of the features.

To prevent charging during etch and other plasma processes, the method of the present invention applies continuous RF power from the RF power source 105 to the antenna 102 during a main part of the process. The RF power source 105 applies pulsed RF power during and after a transition from the main process phase to a subsequent phase. The subsequent phase is one in which the wafer 110 is likely to be damaged by charging. Pulsed RF power is then applied during the subsequent phase. The continuous power applied during the main process phase ensures that the main process does not produce undesirable residue and other process issues, which could disrupt devices on the wafer 110. The pulsed RF power applied during the subsequent phase reduces the electron temperature Te and the electron density $n_e$ of the plasma 130. This technique decreases wafer charging regardless of how the plasma is formed. As such, the method of the present invention is beneficial in any wafer processing context that cause wafer charging, e.g., processing that involves high density plasma, difficult topologies, high aspect ratio structures, and the like.

Figure 2:
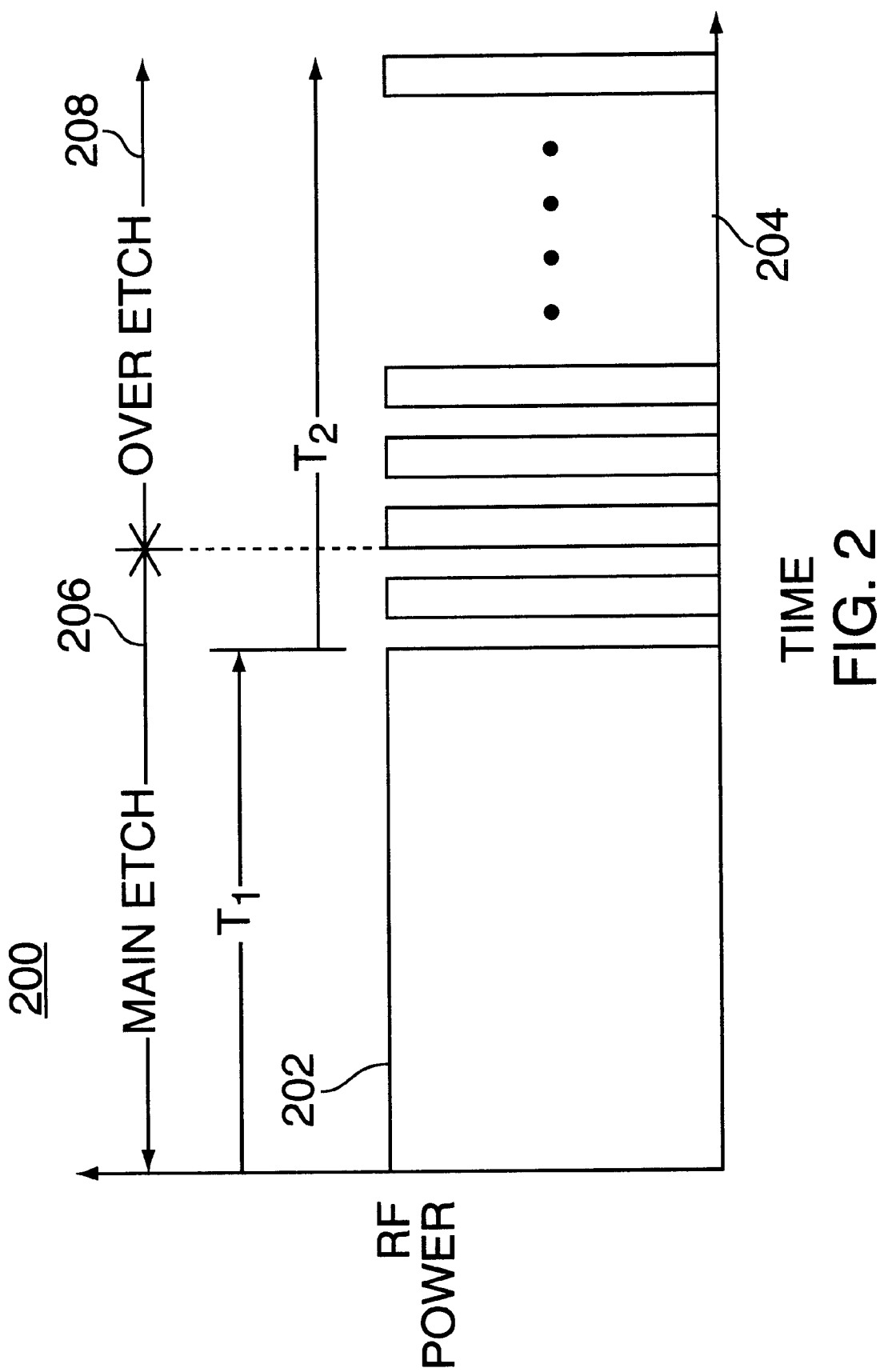
FIG. 2 shows a timing diagram of the method of the present invention.

The method of the present invention as applied to an etch process is illustrated by the timing diagram of FIG. 2. In the diagram 200, RF power 202 is plotted versus time 204. The RF power 202 is applied continuously for an initial period of a main etch phase 206 of an integrated circuit process. After the main etch phase has elapsed, the power is pulsed for a transition from the main etch phase to an over etch phase 208 and at least a portion of the over etch phase 208. By way of example, continuous power is applied during a period of time $T_1$ that encompasses approximately the initial 80% of the main etch phase. Pulsed power is applied during a period of time $T_2$ that encompasses the final 20% of the main etch phase and all of the over etch phase.

The continuous power, applied during $T_1$, prevents the formation of undesirable residue, sidewall attack, and process window degradation during the bulk of the etch process. The pulsed RF power, applied during $T_2$ reduces the electron temperature $T_e$ and electron density $n_e$ of the plasma thereby substantially reducing charging of the wafer 110 and associated damage. During $T_2$, the duty cycle for the pulsed RF power is typically between about 10% and about 90%. The period of the RF pulses is typically between approximately 10 $\mu$s and 1000 $\mu$s.

The change from continuous power to pulsed power can be triggered by a signal from the process monitor 108 indicating the onset of over etch or other process phase in which the wafer 110 is susceptible to charging damage. Alternatively, continuous and pulsed RF power can be applied for empirically predetermined periods of time $T_1$ and $T_2$. In a specific embodiment of the invention, the process progression is monitored as the wafer is processed using optical emission spectroscopy or another process monitoring technique. When the process monitoring technique determines that a period in the process is approaching that may cause charging damage, e.g., the transition from main etch to over etch in a metal etch system, the routine pulses the RF power supply 105.

Figure 3:
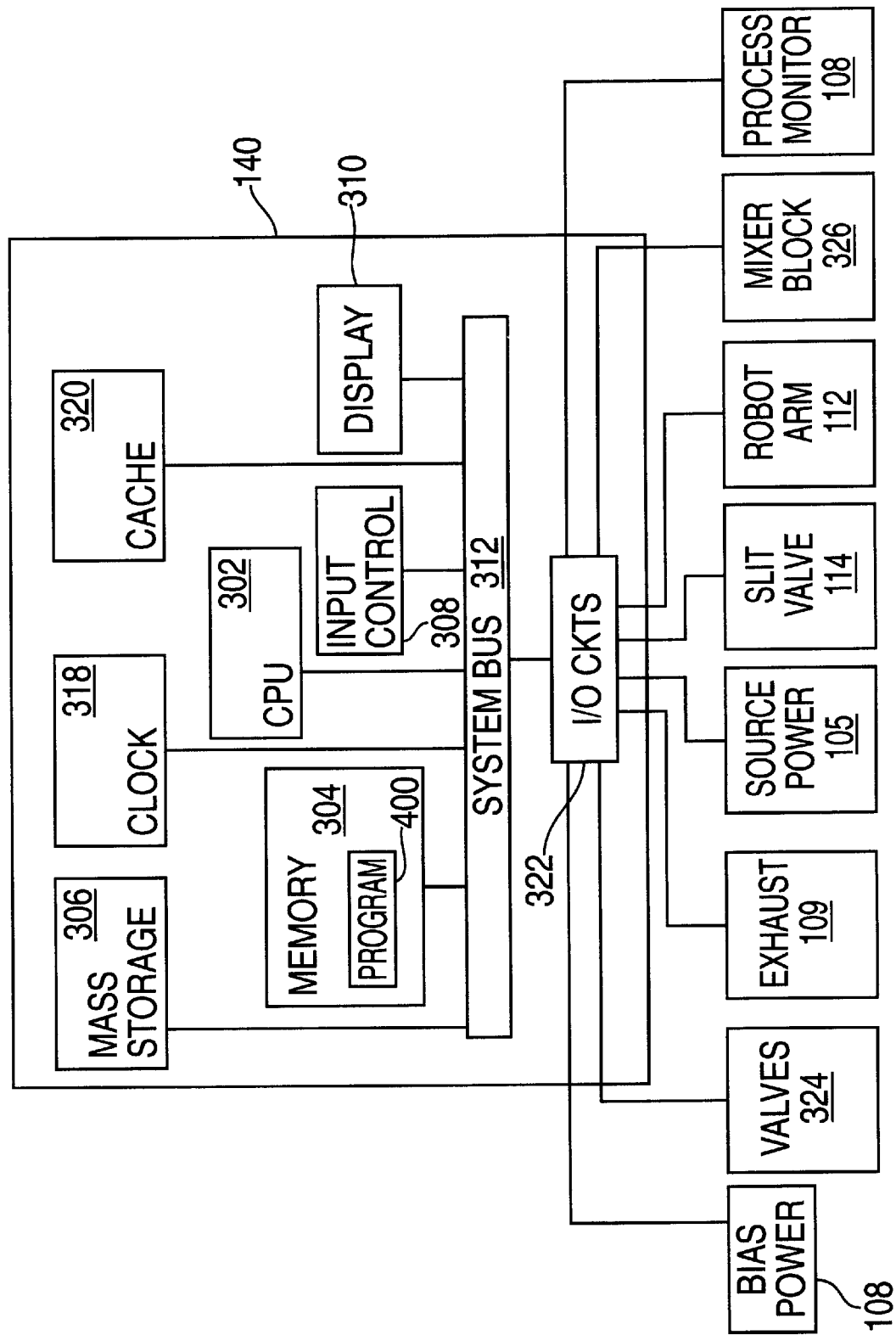
FIG. 3 shows a block diagram of the semiconductor wafer processing system of FIG. 1.

The above-described method can be implemented in a system that is controlled by a processor based system controller such as the controller 140 of FIG. 1. FIG. 3 shows a block diagram of a processing system 100, such as that depicted in FIG. 1, having such a system controller 140 that can be employed in such a capacity. The system controller unit 140 includes a programmable central processing unit (CPU) 302 that is operable with a memory 304, a mass storage device 306, an input control unit 308, and a display unit 310. The system controller further includes well-known support circuits 314 such as power supplies 316, clocks 318, cache 320, input/output (I/O) circuits 322 and the like. The controller 140 also includes hardware for monitoring wafer processing through sensors (not shown) in the chamber 101. Such sensors measure system parameters such as wafer temperature, chamber atmosphere pressure and the like. All of the above elements are coupled to a control system bus 312.

The memory 304 contains instructions that the CPU 302 executes to facilitate the performance of the processing system 300. The instructions in the memory 304 are in the form of program code such as a program 400 that implements the method of the present invention. The program code may conform to any one of a number of different programming languages. For example, the program code can be written in C, C++, BASIC, Pascal, or a number of other languages.

The mass storage device 306 stores data and instructions and retrieves data and program code instructions from a processor readable storage medium, such as a magnetic disk or magnetic tape. For example, the mass storage device 306 can be a hard disk drive, floppy disk drive, tape drive, or optical disk drive. The mass storage device 306 stores and retrieves the instructions in response to directions that it receives from the CPU 302. Data and program code instructions that are stored and retrieved by the mass storage device 306 are employed by the processor unit 302 for operating the processing system 100. The data and program code instructions are first retrieved by the mass storage device 306 from a medium and then transferred to the memory 304 for use by the CPU 302.

The input control unit 308 couples a data input device, such as a keyboard, mouse, or light pen, to the processor unit 302 to provide for the receipt of a chamber operator's inputs. The display unit 310 provides information to a chamber operator in the form of graphical displays and alphanumeric characters under control of the CPU 302.

The control system bus 312 provides for the transfer of data and control signals between all of the devices that are coupled to the control system bus 312. Although the control system bus is displayed as a single bus that directly connects the devices in the CPU 302, the control system bus 312 can also be a collection of busses. For example, the display unit 310, input control unit 308 and mass storage device 306 can be coupled to an input-output peripheral bus, while the CPU 302 and memory 304 are coupled to a local processor bus. The local processor bus and input-output peripheral bus are coupled together to form the control system bus 312.

The system controller 140 is coupled to the elements of the processing system 100, employed in etch processes in accordance with the present invention via the system bus 312 and the I/O circuits 322. These elements include the following: a plurality of valves 324 (such as valve 124 of FIG. 1), The process monitor 108, the exhaust system 109, the RF power supply 105, the slit valve 114, the gas panel 120, the robot arm 112 and an optional mixer block 326 (not shown in FIG. 1, but may be connected to either the gas panel 120 or chamber 101). The system controller 140 provides signals to the chamber elements that cause these elements to perform operations for etching metal in the chamber 101 of FIG. 1.

Figure 4:
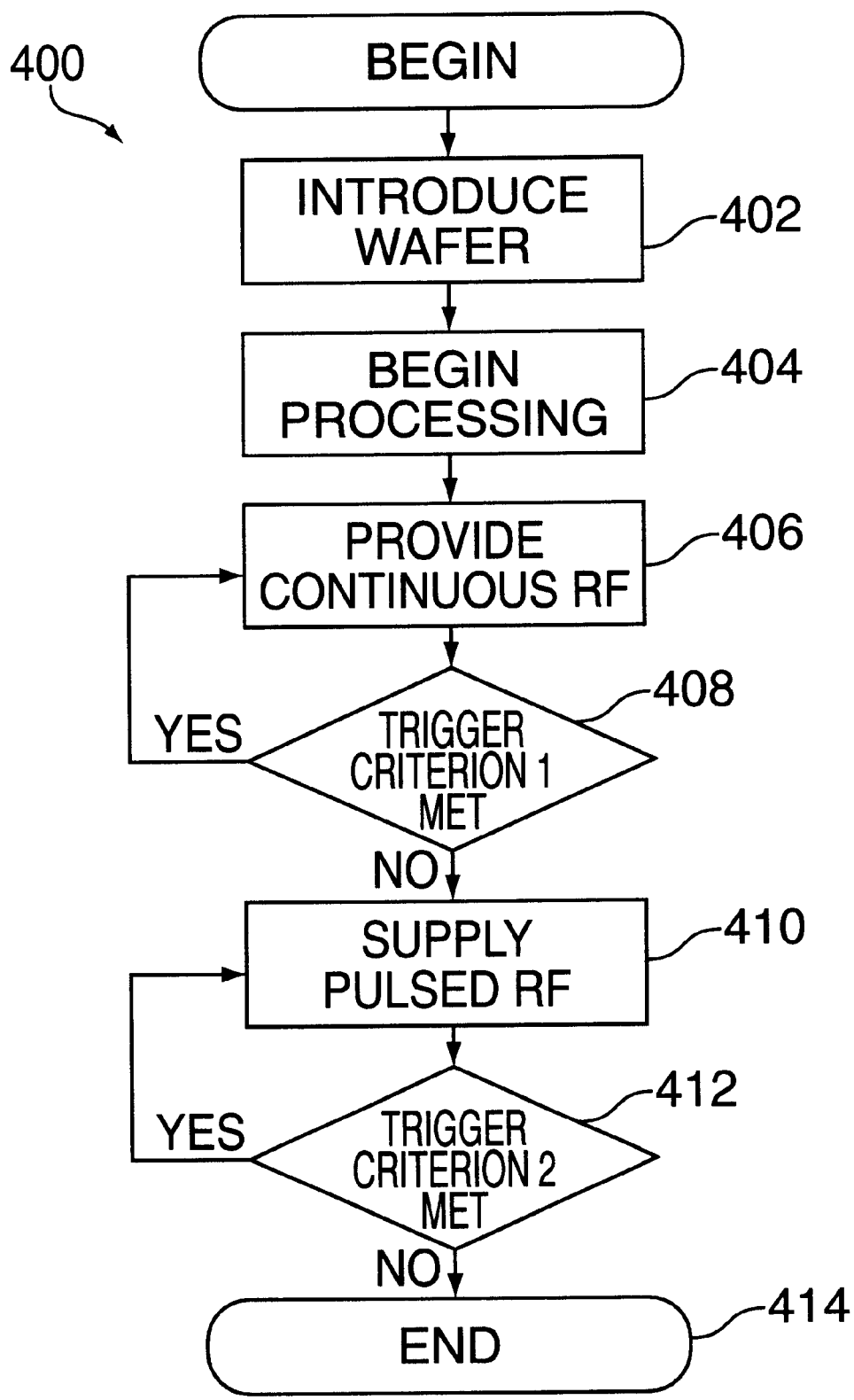
FIG. 4 shows a flow diagram of a computer program that implements the method of the present invention.

The CPU 302 forms a general purpose computer that becomes a specific purpose computer when executing programs such as the program 400 of the embodiment of the method of the present invention depicted in the flow diagram of FIG. 4. Although the invention is described herein as being implemented in software and executed upon a general-purpose computer, those skilled in the art will realize that the invention could be implemented using hardware such as an application specific integrated circuit (ASIC) or other hardware circuitry. As such, it should be understood that the invention can be implemented, in whole or in part, in software, hardware or both.

Those skilled in the art would be readily able to devise a computer program such as the program 400 depicted in FIG. 4. The program 400 begins, at step 402, with the introduction of a workpiece into the process chamber 101. For example, the program 400 executes a first set of instructions that cause the robot arm 112 to insert the wafer 110 through the slit valve 114 and place the wafer 110 on the susceptor 107. A second set of instructions retracts the robot arm 112 through the slit valve 114 and closes the slit valve 114.

Next, in step 404, wafer processing begins. For example, the program 400 executes a third set of instructions that cause the gas panel 120 to introduce a process gas mixture into the main chamber 101. A fourth set of instructions causes the RF power supply 105 to supply RF power to the antenna 102. The RF power ignites and sustains the plasma 130 within the chamber 101. For an etch process, such as metal etch, a gas mixture comprising gases such as Chlorine ($Cl_2$), Boron trichloride ($BCl_3$), and Argon (Ar) is typically provided at a pressure of approximately 9 mTorr. The gases are provided at a flow rates of about 60 standard cubic centimeters per minute (sccm) for $Cl_2$, about 30 sccm for $BCl_3$, and about 50 scam for Ar. The RF signal typically has a frequency of approximately 2 MHz and a power of about 1300 watts. Although the foregoing example describes chamber parameters for etching metal, the invention also finds use in chambers that etch dielectric materials and silicon.

Once processing commences, the program 400 monitors conditions within the chamber 101 by, for example, referring to a signal from the process monitor 108. At step 406, the program 400 executes a fourth set of instructions that cause the RF power supply 105 to provide continuous power until a predetermined trigger criterion is reached. For example, at step 408, the program 400 executes a fifth set of instructions that compares the process monitor signal to predetermined signal indicating the onset of the transition from main etch to over etch. The program 400 continues to instruct the power supply 105 to provide continuous RF power until the trigger criterion is reached. Alternatively, the program 400 can instruct the power supply to provide continuous power for a predetermined period of time $T_1$. Such timing can be accomplished by comparing $T_1$ to a time T measured by the clock 318.

When the trigger criterion has been reached, or time $T_1$ is attained the program 400 executes, at step 410, a sixth set of instructions that signal RF power supply 105 to supply pulsed RF power to the antenna 102. Such instructions can, for example, cause the power supply 105 to turn on and off with a predetermined duty cycle until a second trigger criterion is reached. For example, at step 412, the program 400 executes a seventh set of instructions that compares the process monitor signal to a second predetermined trigger criterion. The program 400 continues to instruct the power supply 105 to provide pulsed RF power until the second trigger criterion is reached. Alternatively, the program 400 can instruct the power supply 105 to provide pulsed power for a second predetermined period of time $T_2$. The program then ends at step 414. The execution of these instructions results in the elements of the processing system 100 being operated to perform a process, such as an etch process, on a semiconductor wafer.

Although a computer program has been disclosed as being capable of producing the signals that pulse the RF power supply 105, the system controller 140 may alternatively issue simple "start" and "stop" signals to a dedicated timing circuit built into the RF power supply 105. Upon receiving a start signal, such a circuit (i.e., a pulse width modulating timer circuit coupled to a power transistor) automatically produces the control signals for driving the power supply 105. The control signals cease upon the system controller 140 issuing a stop signal as a result of a trigger criterion or the lapse of a predetermined period of time.

Figure 5:
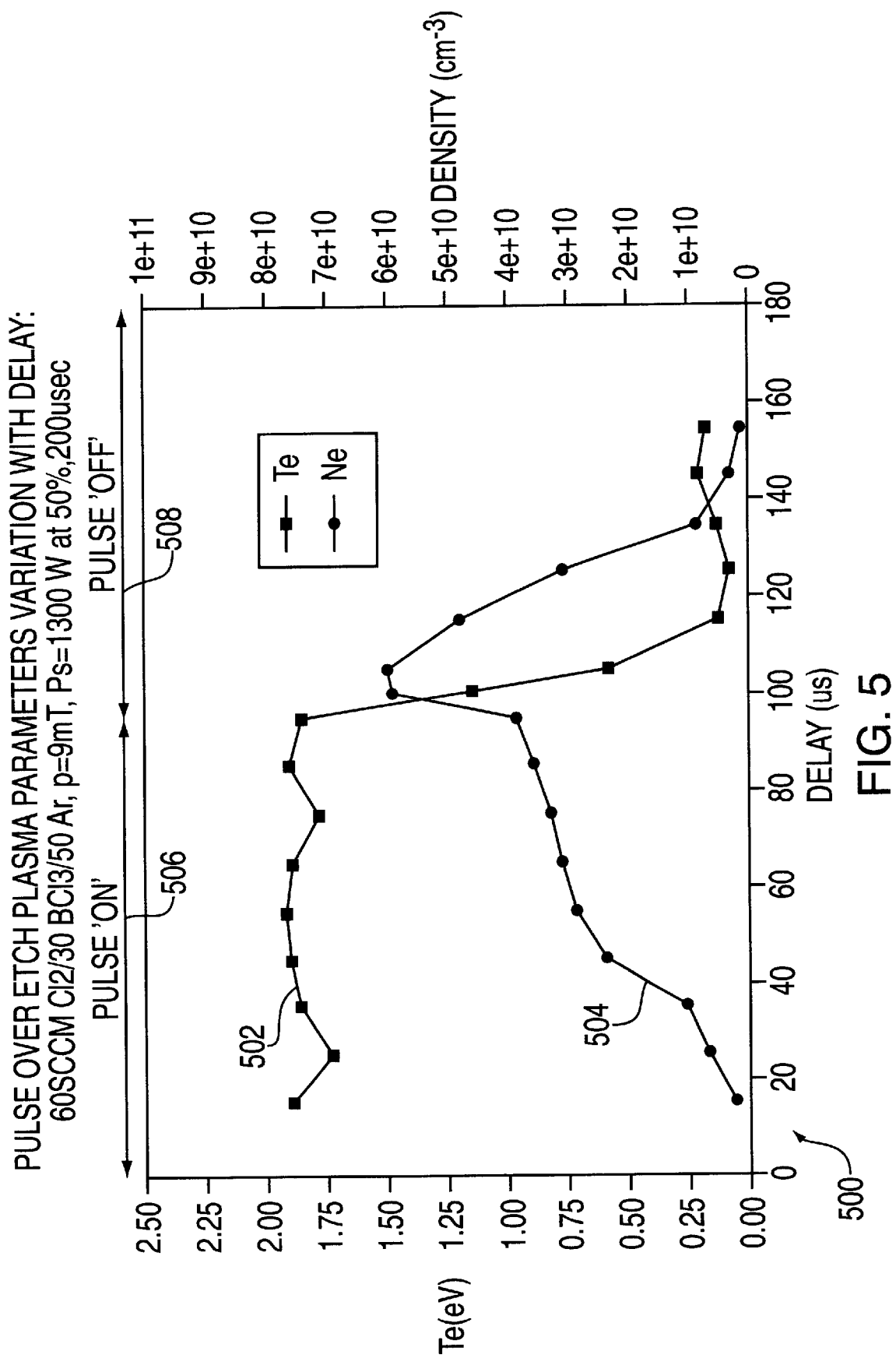
FIG. 5 shows a graph of electron temperature $T_e$ and density $n_e$ versus time for a plasma process according to the present invention.

The advantage of pulsed RF power during the transition to over etch is readily apparent from the graph depicted in FIG. 5. The graph 500 shows electron temperature $T_e$ 502 and density $n_e$ 504 as functions of time in microseconds ($\mu s$) during a RF pulse. The RF power was applied during an over etch portion of an etch process according to the method of the present invention. The RF power was pulsed with a period of 200 μs and a 50% duty cycle. Thus RF power was applied during an "on" portion 506 of the pulse lasting approximately 100 μs. The RF power of approximately 1300 watts was turned off during an "off" portion 508 lasting approximately 100 μs. For this example, $Cl_2$, $BCl_3$ and Ar were provided at flow rates of 60, 30 and 50 sccm respectively.

During the "on" portion 506, the electron temperature $T_e$ 502 remains approximately constant and electron density $n_e$ slowly increases. After the power is turned off, both $T_e$ and $n_e$ drop abruptly to near zero within 20 and 40 μs respectively. The rapid drop in $T_e$ decreases the energy with which electrons impinge upon the wafer 110. The rapid drop in $n_e$ decreases the rate at which electrons impinge upon the wafer 110. Both effects decrease charging of the wafer 110 and avoid charging damage.

The foregoing embodiment used continuous power followed by pulsed power in an etch reactor to reduce topographical charging. The invention also finds use in plasma enhanced deposition processes, such as dielectric deposition, where topographical charging may occur at the beginning of the deposition process. Consequently, pulsed power is used at the beginning of the deposition process followed by continuous power during bulk deposition.

Also, the foregoing embodiment described two phases of plasma processing. However, the invention may be used in a multiphase process, where the plasma is created using continuous power, then pulsed power, then continuous power, then pulsed power and so on, or the plasma is created using pulsed power, then continuous power, then pulsed power, then continuous power and so on.

Wafers containing high aspect ratio structures are prone to topography dependent charging. As such, the invention is greatly beneficial in processing of wafers with high aspect ratio structures.

Although various embodiments which incorporate the teachings of the present invention have been shown and described in detail herein, those skilled in the art can readily devise many other varied embodiments that still incorporate these teachings.

We claim:

1. A method for processing a semiconductor wafer, comprising the steps of:
    forming a plasma proximate the wafer;
    applying continuous RF power to said plasma while etching the wafer with said plasma for a first phase of a main etch process; and
    etching said wafer with pulsed RF power for a second phase of said main etch process, where said first phase ceases and said second phase begins at a time prior to charging damage occurring on said semiconductor wafer.

2. The method of claim 1 wherein said first phase is performed before said second phase.

3. The method of claim 1 wherein said second phase is performed before said first phase.

4. The method of claim 1 further comprising performing herein multiple phases of a process, where each phase includes applying either continuous or pulsed RF power to form said plasma.

5. The method of claim 1 wherein said second phase includes a final portion of the main etch process and at least a portion of an over etch process.

6. The method of claim 1 wherein said first phase is approximately the initial 80% of said main etch process.

7. The method of claim 1 wherein a duty cycle for said pulsed RF power is between approximately 10 percent and 90 percent.

8. The method of claim 1 wherein a period for said pulsed RF power is between about 10 μs and about 1000 μs.

9. The method of claim 1 further comprising the step of monitoring a condition of said main etch process.

10. The method of claim 9 wherein said pulsed power is initiated in response to a change in said condition.

11. The method of claim 9 wherein said condition is an optical emission.

12. The method of claim 1 wherein the wafer comprises high aspect ratio structures.

13. The method of claim 1 wherein said plasma is a high density plasma.

* * * * *